United States Patent
Iwamoto

(10) Patent No.: US 10,062,627 B2
(45) Date of Patent: Aug. 28, 2018

(54) SEMICONDUCTOR DEVICE

(71) Applicant: TOSHIBA MEMORY CORPORATION, Tokyo (JP)

(72) Inventor: Masaji Iwamoto, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/252,158

(22) Filed: Aug. 30, 2016

(65) Prior Publication Data

US 2017/0271231 A1    Sep. 21, 2017

(30) Foreign Application Priority Data

Mar. 17, 2016   (JP) ................ 2016-053319

(51) Int. Cl.
| | |
|---|---|
| H01L 21/56 | (2006.01) |
| H01L 23/31 | (2006.01) |
| H01L 23/00 | (2006.01) |
| H01L 25/065 | (2006.01) |
| H01L 23/552 | (2006.01) |
| H01L 23/29 | (2006.01) |

(52) U.S. Cl.
CPC .......... *H01L 23/3135* (2013.01); *H01L 21/56* (2013.01); *H01L 23/29* (2013.01); *H01L 23/552* (2013.01); *H01L 23/564* (2013.01); *H01L 25/0657* (2013.01); *H01L 2225/06562* (2013.01); *H01L 2225/06582* (2013.01)

(58) Field of Classification Search
CPC ... H01L 23/3135; H01L 23/564; H01L 21/56; H01L 23/29; H01L 23/552; H01L 25/0657; H01L 2225/06562; H01L 2225/06582

USPC .......................................................... 257/659
See application file for complete search history.

(56) References Cited

U.S. PATENT DOCUMENTS

| | | | |
|---|---|---|---|
| 6,803,324 B2 | 10/2004 | Ogawa et al. | |
| 6,831,367 B2 | 12/2004 | Sekine | |
| 6,946,328 B2 | 9/2005 | Kim et al. | |
| 7,064,426 B2 | 6/2006 | Karnezos | |
| 7,633,765 B1* | 12/2009 | Scanlan | H01L 21/4857 174/262 |
| 8,018,033 B2 | 9/2011 | Moriya | |
| 8,338,904 B2 | 12/2012 | Tanida et al. | |
| 8,704,341 B2* | 4/2014 | Lin | H01L 23/49805 257/659 |
| 8,941,246 B2 | 1/2015 | Miura et al. | |
| 9,236,356 B2* | 1/2016 | Yang | H01L 23/49838 |

(Continued)

FOREIGN PATENT DOCUMENTS

| | | |
|---|---|---|
| JP | 2001-127212 | 5/2001 |
| JP | 2002-359345 | 12/2002 |

(Continued)

*Primary Examiner* — Caleen Sullivan
(74) *Attorney, Agent, or Firm* — Patterson & Sheridan, LLP

(57) ABSTRACT

According to one embodiment, a semiconductor device includes a substrate, semiconductor chips mounted on the substrate, a sealing resin layer that seals the semiconductor chips, and a film covering at least an upper surface of the sealing resin layer, the film made from a material selected from the group consisting of zinc, aluminum, manganese, alloys thereof, metal oxides, metal nitrides, and metal oxynitrides.

18 Claims, 2 Drawing Sheets

(56) References Cited

U.S. PATENT DOCUMENTS

| | | | |
|---|---|---|---|
| 9,484,313 B2* | 11/2016 | Chung | H01L 23/60 |
| 2004/0178500 A1* | 9/2004 | Usui | H01L 23/49822 |
| | | | 257/734 |
| 2008/0185692 A1* | 8/2008 | Salzman | H01L 23/552 |
| | | | 257/659 |
| 2011/0169118 A1 | 7/2011 | Sano | |
| 2013/0062758 A1 | 3/2013 | Imoto et al. | |

FOREIGN PATENT DOCUMENTS

| | | |
|---|---|---|
| JP | 2006-019425 | 1/2006 |
| JP | 2007-019412 | 1/2007 |
| JP | 2007-242888 | 9/2007 |
| JP | 2008-305948 | 12/2008 |

* cited by examiner

SEMICONDUCTOR DEVICE

CROSS-REFERENCE TO RELATED APPLICATION

This application is based upon and claims the benefit of priority from Japanese Patent Application No. 2016-053319, filed Mar. 17, 2016, the entire contents of which are incorporated herein by reference.

FIELD

Embodiments described herein relate generally to a semiconductor device.

BACKGROUND

In a semiconductor memory device with built-in memory chips such as a NAND type flash memory, miniaturization and high capacity have advanced rapidly. In a semiconductor memory device, in order to achieve both miniaturization and high capacity, a plurality of memory chips are sequentially stacked on a wiring substrate, and these semiconductor chips are sealed with a resin layer. To reduce the thickness of such a semiconductor device, the thickness of the sealing resin layer on the semiconductor chips is minimized. Such minimization can cause warping during heat treatment such as a solder reflow process.

The resin layer generally warps such that the upper surface of the resin layer is convex at room temperature and concave at elevated temperature. Reducing thickness of the resin layer increases warping, particularly at elevated temperatures. Warping can be suppressed by adjusting properties of the sealing resin, properties of the substrate material, or thickness of the substrate. However, such adjustments increase material cost or substrate cost. In addition, in some cases, needed warp suppression is not available within tolerance merely by adjusting material properties or thickness of the substrate. Therefore, a cost-effective technology is needed that can suppress warping of a semiconductor device.

DETAILED DESCRIPTION

Figure 1:
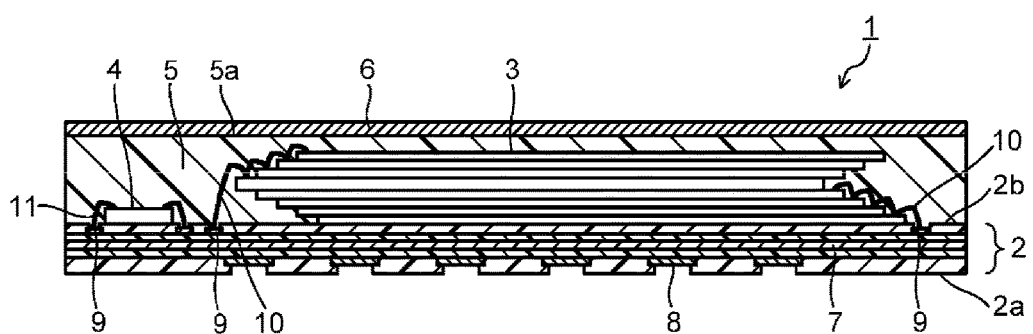
FIG. 1 is a cross-sectional view illustrating a semiconductor device according to a first embodiment.

Embodiments described herein provide a semiconductor device in which warping at elevated temperatures can be suppressed.

In general, according to one embodiment, a semiconductor device includes: a substrate; one or more semiconductor chips mounted on the substrate; a sealing resin layer that seals the one or more semiconductor chips; and a film covering at least an upper surface of the sealing resin layer, the film made from a material selected from the group consisting of zinc, aluminum, manganese, alloys thereof, metal oxides, metal nitrides, and metal oxynitrides.

Hereinafter, a semiconductor device according to embodiments will be described with reference to the drawings. In each embodiment, the same reference numerals will be given to the same or similar members, and in some cases, the description thereof will not be repeated. The drawings are schematic, and in some cases, various dimensions, thicknesses, and ratios of dimensions may be different from embodiment to embodiment. Terminologies indicating directions such as upper and lower in the description indicate directions relative to a basis direction, and may not correspond to the direction of gravity.

First Embodiment

Figure 2:
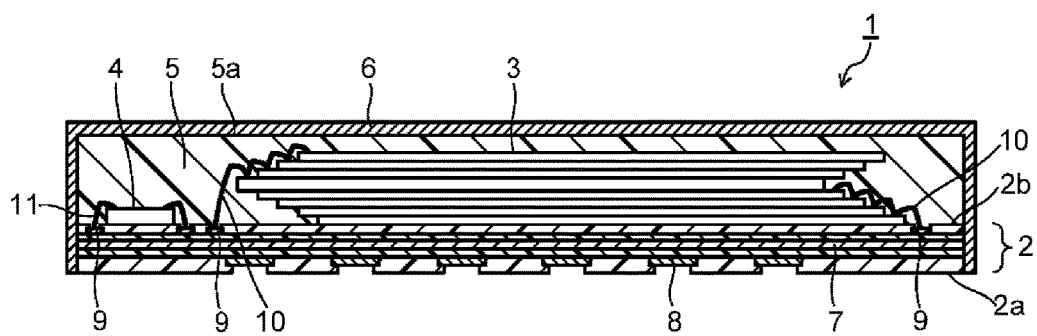
FIG. 2 is a cross-sectional view of a modification of the semiconductor device according to the first embodiment.

FIG. 1 is a cross-sectional view illustrating a semiconductor device 1 according to a first embodiment. The semiconductor device 1 illustrated in FIG. 1 includes a substrate 2, semiconductor chips 3 and 4 mounted on the substrate 2, a sealing resin layer 5 that seals the semiconductor chips 3 and 4, and a warp adjusting film 6 covering an upper surface 5a of the sealing resin layer 5. As illustrated in FIG. 2, the warp adjusting film 6 may be provided so as cover not only the upper surface 5a of the sealing resin layer 5 but also side surfaces of the sealing resin layer 5 and side surfaces of the substrate 2. The embodiment described below in detail has a warp adjusting film 6 covering only the upper surface 5a of sealing resin layer 5. Such an embodiment reduces manufacturing cost relative to the embodiment of FIG. 2.

The substrate 2 is a wiring substrate in which a wiring network (not illustrated) is provided on the surface, or inside, of an insulating resin substrate. One example is a printed-wiring board (a multi-stacked printed board) using glass-epoxy resin or BT resin (bismaleimide triazine resin). The wiring substrate 2 of the printed-wiring board normally includes a copper (Cu) layer 7 as a wiring network. The wiring substrate 2 includes a first surface 2a which is an external terminal forming surface and a second surface 2b which is a surface on which the semiconductor chips 3 and 4 are mounted. The first surface 2a of the wiring substrate 2 includes an external electrode 8.

The external terminals (not illustrated) are formed on the external electrode 8 of the wiring substrate 2. In a case where the semiconductor device 1 is used as a BGA package, the external terminal is a protrusion terminal using a solder ball or solder plating. In a case where the semiconductor device 1 is used as a LGA package, a metal land using gold (Au) plating is adopted as the external terminal. The second surface 2b of the wiring substrate 2 which is the surface on which the semiconductor chips 3 and 4 are mounted includes an internal electrode 9. At least a portion of the internal electrode 9 is electrically connected to the external terminals through the wiring network of the wiring substrate 2 or the external electrode 8.

A first semiconductor chip 3 is mounted on the second surface 2b of the wiring substrate 2. The first semiconductor chip 3 may include a plurality of layers stacked in a stepwise manner such that each of the electrode pads can be exposed. A specific example of the first semiconductor chip 3 includes memory chips such as NAND type flash memories, but is not limited thereto. FIG. 1 illustrates a structure in which the first semiconductor chip 3 has four layers stacked in a stepwise manner offset in a first direction, and four more layers arranged thereon stacked in a stepwise manner offset in a direction opposite to the first direction. However, the number of layers in the first semiconductor chip 3 mounted on the wiring substrate 2 or the mounting structure is not limited to those described above. The number of layers in the first semiconductor chip 3 may be either one or a multiple number.

Among the multiple layers of the first semiconductor chip 3 shown in FIG. 1, the first layer is adhered to the second surface 2b of the wiring substrate 2 using an adhesive layer (not illustrated). Each subsequent layer may also be adhered to the previous layer using an adhesive layer. The electrode pads of the first to fourth layers of the first semiconductor chip 3 are exposed upward by offsetting the stacked layers respectively, and are electrically connected to the internal electrode 9 of the wiring substrate 2 through a bonding wire 10. The fifth to eighth layers of the first semiconductor chip 3 are stacked on the fourth layer in the direction opposite to the first direction such that the electrode pads are exposed. The electrode pads of the fifth to eighth layers of the first semiconductor chip 3 are electrically connected to the internal electrode 9 through a bonding wire 10.

Second semiconductor chips 4 (only one is shown in FIG. 1) are further mounted on the second surface 2b of the wiring substrate 2. The electrode pads of the second semiconductor chips 4 are electrically connected to the internal electrode 9 of the wiring substrate 2 through a bonding wire 11. Examples of the second semiconductor chips 4 include a controller chip that transmits and receives digital signals between the first semiconductor chip 3 and external devices in cases where the semiconductor device 1 is a memory device, system LSI chips such as an interface chip, a logic chip, and an RF chip. The second semiconductor chip 4 may be buried into, or attached to, the adhesion layer that adheres the first semiconductor chip 3 to the second surface 2b of the wiring substrate 2. The second semiconductor chip 4 may be arranged on the first semiconductor chip 3. However, by mounting the second semiconductor chip 4 on the second surface 2b of the wiring substrate 2, it is possible to reduce the wiring length from the second semiconductor chip 4 such as the system LSI chip to the wiring substrate 2. Therefore, it is possible to speed up the response of the semiconductor device 1.

The sealing resin layer 5 containing an insulating resin such as epoxy resin is, for example, molded on the second surface 2b of the wiring substrate 2 such that the first semiconductor chip 3 and the second semiconductor chip 4 are sealed together with the bonding wires 10 and 11. The thickness of the sealing resin layer 5 on the first semiconductor chip 3 is not particularly limited, but may be equal to or less than 300 μm for minimizing the thickness of the semiconductor device 1. The thickness of the semiconductor device 1, which may have a memory chip such as a NAND type flash memory embedded as the first semiconductor chip 3, is typically minimized for use in mobile electronic devices. For such uses, the thickness of the resin on the semiconductor chips 3 is typically equal to or less than 150 μm. To provide good sealing of the first semiconductor chip 3 and sufficient engraving depth for laser marking, the thickness of the resin on the semiconductor chip 3 is typically equal to or more than 50 μm.

The warp adjusting film 6 for suppressing warping of the semiconductor device 1, particularly at elevated temperature, is provided on the upper surface 5a of the sealing resin layer 5. The warp adjusting film 6 is formed on the sealing resin layer 5 using, for example, a sputtering method or a vapor deposition method. Materials for forming the warp adjusting film 6 may be selected from the group consisting of zinc (Zn), aluminum (Al), and manganese (Mn), alloys thereof, a metal oxide, metal nitride, and metal oxynitrides. Combinations of the above materials may also be used. Here, the elastic modulus of the resin material forming the sealing resin layer 5 is low. For example, the Young's modulus of a typical epoxy resin is approximately 30 GPa.

In contrast, any of the Young's modulus of the metals (Zn, Al, and Mn) described above exceeds 30 GPa.

By forming the warp adjusting film 6 on the sealing resin layer 5 using materials having an elastic modulus higher than that of the sealing resin layer 5, expansion of the sealing resin layer 5 is suppressed when, for example, the semiconductor device 1 is heated from room temperature (25° C.) to a secondary mounting temperature (for example, 250° C.). Therefore, warping of the semiconductor device 1 is suppressed at elevated temperatures. As noted above, the Young's modulus of the warp adjusting film 6 typically exceeds 30 GPa, and may be equal to or higher than 50 GPa. Alloys of the above-described metals (Zn, Al, and Mn) have elastic modulus similar to the metals themselves, so an alloy film of any of the above metals can be used for the warp adjusting film 6.

Furthermore, instead of the metal film or the alloy film described above, a metal compound film such as a film of metal oxides, metal nitrides, and/or metal oxynitrides may be used as the warp adjusting film 6. The metal compound film has elastic modulus equal to or higher than that of the metal film or the alloy film described above, as well as high hardness, which will suppress warping at elevated temperature. Examples of metal compounds that may be used in the warp adjusting film 6 are not particularly limited, and may include metal oxides such as alumina ($Al_2O_3$), silicon oxide ($SiO_2$), titanium oxide ($TiO_2$), and zirconium oxide ($ZrO_2$), metal nitrides such as silicon nitride ($Si_3N_4$), aluminum nitride (AlN), and titanium nitride (TiN), and metal oxynitrides such as silicon oxynitride (SiON) and sialon, or silicon aluminum oxynitride (SiAlON).

More useful materials for forming the warp adjusting film 6 have a thermal expansion coefficient higher than the thermal expansion coefficient of Cu ($16.2 \times 10^{-6}$/° C.). As described above, generally, the wiring substrate 2 has a Cu layer 7 as the wiring network. In the semiconductor device 1, the Cu wiring layer 7 contributes to the expansion of the wiring substrate 2 during heating. Therefore, in a thin type embodiment of the semiconductor device 1, warping increases. In this regard, by using a material with thermal expansion coefficient higher than that of the Cu layer 7 to form the warp adjusting film 6 on the sealing resin layer 5, it is possible to suppress warping of the semiconductor device 1 caused or enhanced by the thermal expansion the Cu layer 7.

Examples of materials having the thermal expansion coefficient ($\alpha$) higher than that of Cu include the metals Zn ($\alpha = 30.2 \times 10^{-6}$/° C.), Al ($\alpha = 23.7 \times 10^{-6}$/° C.), and Mn ($\alpha = 21.6 \times 10^{-6}$/° C.), or alloys of any of these metals. Young's modulus and thermal expansion coefficient of various materials usable for forming the warp adjusting film 6 are listed in Table 1. Most materials useful for forming the warp adjusting film 6 have thermal expansion coefficient (a) that is higher than $16.2 \times 10^{-6}$/° C., and some are equal to higher than $20 \times 10^{-6}$/° C.

TABLE 1

| Material for forming the warp adjusting film | Young's modulus (GPa) | Thermal expansion coefficient ($10^{-6}$/° C.) |
|---|---|---|
| Zn | 96.5 | 30.2 |
| Al | 68.3 | 23.7 |
| Mn | 159 | 21.6 |

A thickness of the warp adjusting film 6 may be equal to or greater than 0.5 μm and equal to or less than 5 μm. When the thickness of the warp adjusting film 6 is less than 0.5 μm, warp suppression of the sealing resin layer 5 at elevated temperatures may be inadequate. When the thickness of the warp adjusting film 6 exceeds 5 µm, adhesion of the warp adjusting film 6 to the sealing resin layer 5 tends to deteriorate when the warp adjusting film 6 is formed by sputtering or other vapor deposition methods, reducing effectiveness of warp suppression. In such a case, deforming of the sealing resin layer 5 caused by the expansion of the sealing resin layer 5 at the time of heating or the expansion of the wiring substrate 2 (particularly, Cu layer 7) remains excessive. Furthermore, when the thickness of the warp adjusting film 6 is increased, the cost for forming the film increases and it becomes difficult to minimize the thickness of the semiconductor device 1. The thickness of the warp adjusting film 6 may be equal to or greater than 1 µm and equal to or less than 3 µm.

As described above, it is possible to suppress the expansion of the sealing resin layer 5 at the time of heating by forming the warp adjusting film 6 on the sealing resin layer 5 using a material having elastic modulus higher than that of the material forming the sealing resin layer 5. Furthermore, by using a warp adjusting film 6 made from a material which satisfies the above-described elastic modulus and has thermal expansion coefficient higher than that of the Cu layer 7, it is possible to suppress the expansion of the sealing resin layer 5 caused by the thermal expansion of the Cu layer 7 during heating. In this way, the thickness of the resin on the first semiconductor chip 3 can be reduced, and thus, it is possible to reduce the amount of warp of the semiconductor device 1 during heating, especially the warping in which the upper surface 5a of the sealing resin layer 5 is deformed to a concave shape. Furthermore, since warping of the semiconductor device 1 is suppressed by the warp adjusting film 6, it is possible to keep manufacturing cost of the semiconductor device 1 low. Therefore, it is possible to provide a thin type semiconductor device 1 having less warp at a low cost.

Warp suppression using the warp adjusting film 6 can be confirmed by measuring warping of a semiconductor device that does not have the warp adjusting film 6 and comparing to warping of the semiconductor device 1. Such measurements typically return a positive value representing convex warping and a negative value representing concave warping. A semiconductor device such as the semiconductor device 1, but without the warp adjustment film 6, warps in a convex shape (positive value) at room temperature, and deforms to a concave shape (negative value) when heated, as confirmed by measurements as described above.

As described above, the amount of warp during heating of the semiconductor device not including the warp adjusting film 6 is large and can exceed an allowable tolerance of the warp in the semiconductor device. On the contrary, in a case of the semiconductor device including the warp adjusting film 6, it is confirmed that the semiconductor device 1 has a convex shape (positive value) at room temperature, and is deformed during heating, but the deformation is small and the amount of warp during heating also has a positive value.

The warp adjusting film 6 may be provided so as to cover only the upper surface 5a of the sealing resin layer 5 as described above, or may be provided so as to cover the side surfaces of the sealing resin layer 5 and the side surfaces of the substrate 2. When the warp adjusting film 6 is applied so as to cover all of the sealing resin layer 5 or the side surfaces of the substrate 2, the warp adjusting film 6 is applied after dividing the semiconductor device 1 from neighboring devices on a manufacturing substrate. However, when the warp adjusting film 6 is provided so as to cover only the upper surface 5a of the sealing resin layer 5, the warp adjusting film 6 can be formed during the wafer process prior to dividing the wafer into individual devices, so cost of forming the warp adjusting film 6 is reduced. By providing the warp adjusting film 6 so as to cover only the upper surface 5a of the sealing resin layer 5, it is possible to obtain excellent warp suppression effect at low cost.

Second Embodiment

Figure 3:
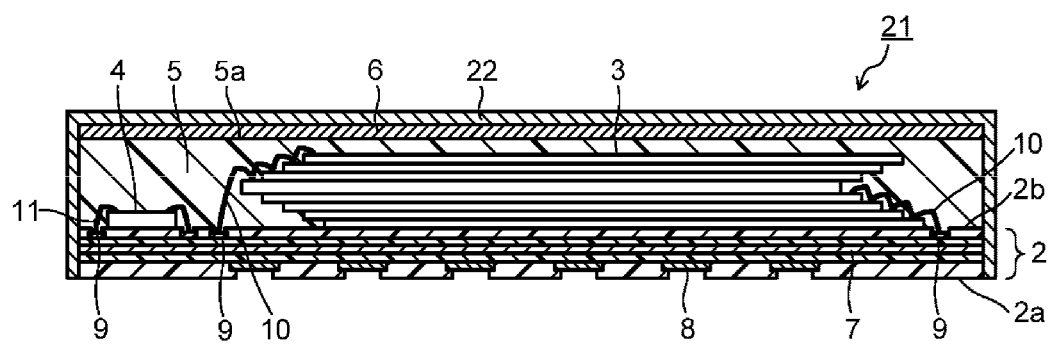
FIG. 3 is a cross-sectional view illustrating a semiconductor device according to a second embodiment.

FIG. 3 is a cross-sectional view illustrating a configuration of a semiconductor device 21 according to a second embodiment. The semiconductor device 21 illustrated in FIG. 3 includes a conductive shield layer 22 provided so as to cover a front surface of the warp adjusting film 6, side surfaces of the sealing resin layer 5, and the side surfaces of the substrate 2 in addition to the configuration of the semiconductor device 1 illustrated in FIG. 1. The conductive shield layer 22 prevents emission of extraneous electromagnetic waves from the first and second semiconductor chips 3 and 4 and the wiring substrate 2, and preventing electromagnetic interference from the external devices affecting the first and second semiconductor chips 3 and 4. For example, when the semiconductor chip 3 includes a magneto-resistive memory (MRAM) element, it is usually necessary to shield the MRAM element from external electromagnetic waves. In the semiconductor device 21, the conductive shield layer 22 provides such shielding.

The conductive shield layer 22 is electrically connected to a ground in the wiring substrate 2. In order to electrically connect the conductive shield layer 22 to the ground, a portion of the ground is exposed at the side surface of the wiring substrate 2. The conductive shield layer 22 is electrically connected to the portion of the ground exposed at the side surface of the wiring substrate 2. The conductive shield layer 22 is formed by sputtering metal materials such as copper, silver, or nickel on the front surface of the semiconductor device 21 after dicing. It can be useful to select a thickness of the conductive shield layer 22 based on a resistivity thereof. For example, thickness of the conductive shield layer 22 may be selected such that a sheet resistance value (resistivity of the conductive shield layer 22 divided by the thickness) becomes equal to or lower than $0.5\Omega$. In this way, it is possible to repeatability suppress emission of extraneous electromagnetic waves from the semiconductor device 21 or interference from external electromagnetic waves.

The warp adjusting film 6 and the conductive shield layer 22 are not limited to be formed on the above-described sealing resin layer 5 in the order shown in the figures. The conductive shield layer 22 may be formed directly on the sealing resin layer 5, and the warp adjusting film 6 may be formed on the conductive shield layer 22. In such cases, the warp adjusting film 6 is performed after dicing, since dicing precedes forming the conductive shield layer 22. To take advantage of the efficiency of forming the warp adjusting film 6 over the entire manufacturing substrate, the warp adjusting film 6 may be formed over the entire substrate, the substrate may be diced into individual devices, and then the conductive shield layer 22 may be formed to cover the warp adjusting film 6 and the side surfaces of the wiring substrate 2. Furthermore, by directly forming the warp adjusting film 6 on the sealing resin layer 5, adhesion of the warp adjusting film 6 is improved.

Third Embodiment

Figure 4:
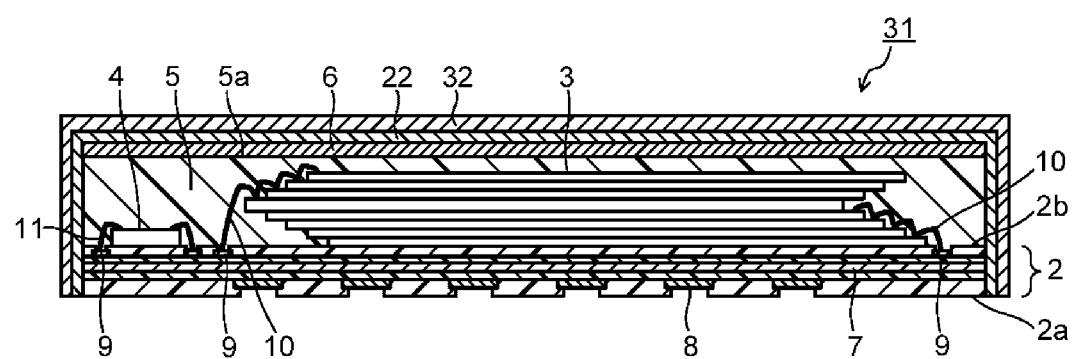
FIG. 4 is a cross-sectional view illustrating a semiconductor device according to a third embodiment.

FIG. 4 is a cross-sectional view illustrating a configuration of a semiconductor device 31 according to a third embodiment. The semiconductor device 31 illustrated in FIG. 4 includes a protective layer 32 covering the conductive shield layer 22 in addition to the configuration of the semiconductor device 21 illustrated in FIG. 3. A more useful material of the protective layer 32 will have excellent in corrosion resistance. Stainless steel is an example. By covering the front surface of the semiconductor device including the warp adjusting film 6 and the conductive shield layer 22 with the protective layer 32, it is possible to suppress deterioration of the functions of the warp adjusting film 6 and the conductive shield layer 22 due to moisture or the like in the atmosphere. Here, an example of providing the protective layer 32 on the conductive shield layer 22 is described. However, when the conductive shield layer 22 is not necessary, the protective layer 32 may be provided directly on the warp adjusting film 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
semiconductor chips mounted on the substrate;
a sealing resin layer disposed over and sealing the semiconductor chips, the sealing resin layer having an upper surface and side surfaces; and
a film entirely covering the upper surface of the sealing resin layer, the film made from a material selected from the group consisting of zinc, aluminum, manganese, alloys thereof, metal oxides, metal nitrides, and metal oxynitrides, wherein side surfaces of the sealing resin layer are exposed.

2. The device according to claim 1, wherein the film has a Young's modulus exceeding 30 GPa and a thermal expansion coefficient exceeding $16.2 \times 10^{-6°}$ C.

3. The device according to claim 2, wherein the film has a thickness equal to or greater than 0.5 μm and equal to or less than 5 μm.

4. The device according to claim 3, wherein a thickness of the sealing resin layer between an upper surface of the semiconductor chips and a lower surface of the film is equal to or less than 300 μm.

5. The device according to claim 1, wherein the film is made from a metal compound.

6. A semiconductor device comprising:
a substrate;
semiconductor chips mounted on the substrate;
a sealing resin layer disposed over and sealing the semiconductor chips, the sealing resin layer having an upper surface and side surfaces; and
a film entirely covering the upper surface of the sealing resin layer, the film having a thickness equal to or greater than 0.5 μm and equal to or less than 5 μm, wherein the film is made from a material selected from the group consisting of zinc, aluminum, manganese, alloys thereof, metal oxides, metal nitrides, and metal oxynitrides, wherein side surfaces of the sealing resin layer are exposed.

7. The device according to claim 6, wherein the film is made from a material having a Young's modulus equal to or higher than 50 GPa.

8. The device according to claim 7, further comprising a conductive shield layer that connects to a ground wire at the side surface of the substrate.

9. The semiconductor device of claim 6, wherein a thickness of the sealing resin layer on between an upper surface of the semiconductor chips and a lower surface of the film is equal to or less than 300 μm.

10. A semiconductor device comprising:
a substrate;
semiconductor chips mounted on the substrate;
a sealing resin layer disposed over and sealing the semiconductor chips, the sealing resin layer having an upper surface and side surfaces; and
a film covering at least an upper surface of the sealing resin layer, the film made from a material selected from the group consisting of zinc, manganese, alloys thereof, metal oxides, metal nitrides, and metal oxynitrides.

11. The device according to claim 10, wherein the film has a Young's modulus exceeding 30 GPa and a thermal expansion coefficient exceeding $16.2 \times 10^{-6°}$ C.

12. The device according to claim 11, wherein the film has a thickness equal to or greater than 0.5 μm and equal to or less than 5 μm.

13. The device according to claim 12, wherein a thickness of the sealing resin layer on the semiconductor chips is equal to or less than 300 μm.

14. The device according to claim 13, wherein the film covers only the upper surface of the sealing resin layer, and the device further comprises at least one of a conductive shield layer and a protective layer covering a front surface of the film, a side surface of the sealing resin layer, and a side surface of the substrate.

15. The device according to claim 10, wherein the film is made from a metal compound.

16. The device according to claim 15, further comprising at least one of a conductive shield layer and a protective layer.

17. The device according to claim 16, wherein the conductive shield layer covers a front surface of the film, a side surface of the sealing resin layer, and a side surface of the substrate.

18. The device according to claim 17, wherein the protective layer is corrosion resistant.

* * * * *